(12) United States Patent
Narayan et al.

(10) Patent No.: US 6,436,585 B1
(45) Date of Patent: Aug. 20, 2002

(54) METHOD OF USING OPTICAL PROXIMITY EFFECTS TO CREATE ELECTRICALLY BLOWN FUSES WITH SUB-CRITICAL DIMENSION NECK DOWNS

(75) Inventors: Chandrasekhar Narayan, Hopewell Junction; Axel Brintzinger, Fishkill; Fred L. Einspruch, Sparrowbush, all of NY (US); Henning Haffner, Dresden (DE); Alan C. Thomas, Hughsonville, NY (US)

(73) Assignees: International Business Machines Corporation, Armonk, NY (US); Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/512,923

(22) Filed: Feb. 25, 2000

(51) Int. Cl.⁷ ............................. G03F 9/00; H01L 21/82
(52) U.S. Cl. ............................................ 430/5; 438/132
(58) Field of Search ..................... 430/5, 311; 438/132, 438/381, 382, 384

(56) References Cited

U.S. PATENT DOCUMENTS

| | | | |
|---|---|---|---|
| 4,635,345 A | 1/1987 | Hankins et al. | 29/577 |
| 5,313,424 A | 5/1994 | Adams et al. | 365/200 |
| 5,420,456 A | 5/1995 | Galbi et al. | 257/529 |
| 5,436,496 A | 7/1995 | Jerome et al. | 257/529 |
| 5,447,810 A | 9/1995 | Chen et al. | 430/5 |
| 6,190,986 B1 * | 2/2001 | Arndt et al. | 438/381 |
| 6,261,873 B1 * | 7/2001 | Bouldin et al. | 438/132 |

FOREIGN PATENT DOCUMENTS

JP 403124047 5/1991

OTHER PUBLICATIONS

"Manufacturing Implementation of 2D Optical Proximity Correction", J. Bruce, O. Bula, E. Conrad and A, McGuire; IBM Microelectronics Div., Vermont, pp. 97–112.

"Use of a Single Size Square Serif for Variable Print Bias Compensation in Microlithography: Method, Design and Practice"; A. Starikov; International Business Machines, New York; SPIE vol. 1088, 1989, pp. 34–46.

"Mask Assisted Off–axis Illumination Technique for Random Logic"; J. Garafalo, C. J. Biddick, R. L. Kostelak and S. Vaidya, A T & T Bell Laboratories; J. Vac. Sci. Tech. B11(6), Nov./Dec. 1993, pp. 2651–2658.

* cited by examiner

Primary Examiner—S. Rosasco
(74) Attorney, Agent, or Firm—DeLio & Peterson, LLC; Peter W. Peterson; H. Daniel Schnurmann

(57) ABSTRACT

A method of making a photolithography mask for use in creating an electrical fuse on a semiconductor structure comprises initially determining a pattern for a desired electrical fuse, with the pattern including a fuse portion of substantially constant width except for a localized narrowed region of the fuse portion at which the electrical fuse is designed to blow. The method then includes providing a photolithography mask substrate and creating on the photolithography mask substrate a fuse mask element adapted to absorb transmission of an energy beam. The fuse mask element has a first mask portion of substantially constant width corresponding to the desired electrical fuse pattern portion of substantially constant width, and a second mask portion corresponding to the localized narrowed region of the fuse portion. The second mask portion comprises either an additional mask element spaced from the first mask portion, a narrowed width portion, or a gap in the first mask portion. The second mask portion is of a configuration sufficient to create a latent image of the electrical fuse pattern, including the localized narrowed region of the fuse portion at which the electrical fuse is designed to blow, upon passing the energy beam through the photolithography mask and onto a resist layer. Preferably, the fuse portion of substantially constant width on the determined fuse pattern has a design width less than about 0.25 μm, and wherein the localized narrowed region of the fuse portion has a design width less than the design width of the fuse portion.

26 Claims, 4 Drawing Sheets

METHOD OF USING OPTICAL PROXIMITY EFFECTS TO CREATE ELECTRICALLY BLOWN FUSES WITH SUB-CRITICAL DIMENSION NECK DOWNS

BACKGROUND OF THE INVENTION

1. Field of the Invention

This invention relates to semiconductor fabrication and more particularly, to an improved method and apparatus for forming electrical fuses by a photolithographic process using a novel mask structure.

2. Description of Related Art

In fabricating microelectronic semiconductor devices on a wafer substrate or chip, such as of silicon, to form an integrated circuit (IC), various metal layers and insulation layers are deposited in selective sequence. To maximize integration of device components in the available substrate area to fit more components in the same area, increased IC miniaturization is utilized. Reduced pitch dimensions are needed for denser packing of components per present day very large scale integration (VLSI), e.g., at sub-micron (below 1 micron, i.e., 1,000 nanometer or 10,000 angstrom) dimensions. Redundancy techniques are used in semiconductor fabrication to provide deliberate duplication of circuit components to decrease the probability of a circuit failure and thus increase circuit reliability. To offset defects that can occur in the circuitry, multiple copies of a given circuit component can be connected in parallel to achieve continued operation upon failure of a particular component. Each such multiple component can be provided with a set of fuses that can be blown to replace a failed component by a duplicate one during fusing operation of redundancy activation, e.g., at final IC chip testing.

Some ICs have conductive links between semiconductor devices that are coupled to fuses that can be laser cut (blown) after fabrication. Thus, in a dynamic random access memory (DRAM) circuit, fuses can protect transistor gate stacks from destruction due to inadvertent build-up charges. After IC fabrication, the fuses can be blown to permit the DRAM circuit to function as if the protective current paths never existed. Also, fuses are used to set the enable bit and the address bits of a redundant array element in a DRAM circuit. To replace a defective main memory array element within a main memory array, a redundant array is provided which has a plurality of fuses in a fuse decoder array. In replacing a defective main memory array element, individual fuses in the fuse array are blown to set their values to either a "1" or a "0" as required by the decoder circuit. During operation, the values of the fuses in the fuse array are loaded into the fuse latch array upon power up, and these values then decoded by the fuse decoder circuit during run time. This facilitates replacement of specific failed main memory array elements by specific redundant elements of the redundant array, all by well known techniques.

In particular, high density DRAMs are commonly designed with memory cell redundancy whereby the redundant memory cells avoid loss of an entire memory in the event that a minor number of memory cells fail to function. Redundant memory cell activation is effected by blowing fuses selectively placed throughout the memory. Blowing a set of fuses disables the defective memory cell and enables in its place a redundant working memory cell.

Fuses may also be incorporated in an IC of a semiconductor device module adapted for custom wiring operation, depending on the requirements of the end user. By blowing selective fuses in the circuit, the semiconductor device module can be customized for particular purposes. Fuse blowing is effected by heating the fuse to melt it, and creating an open circuit, e.g., to replace a defective memory cell or other component by a functional cell or different component. The fuse is usually of aluminum, copper or other highly conductive metal or metal alloy, and has a central portion or fuse segment (fuse link) of smaller cross sectional area than its ends (connector terminals) to reduce the energy needed to melt the fuse and create an open circuit condition. The melting (blowing) of fuses can be effected by a laser beam with a controlled beam width. This can result in laser-induced damage to the area beneath the fuse link, mainly due to absorption of laser energy. Alternatively, fuses can be electrically blown by applying a high current thereto for heating the fuse link by electrical power. To enable electrical fusing with voltages below about 10 volts in semiconductor devices, it is important that the cross sectional area reduction from the connector terminals to the electrical fuse segment (fuse link) be as large as possible, preferably greater than 5 or 10. However, the need for such large connector terminals limits the proximity of neighboring fuses. The voltage necessary to activate an electrical fuse is very sensitive to the geometry of the fuse. The shape of the fuse, its linearity, and the size of the connector terminals all impact the voltage needed to blow the fuse. It is, therefore, important that the fuse geometry be optimized.

An electrical fuse is basically an expendable overcurrent protective device having a circuit-opening fusible (meltable) conductive, e.g., metal or metallic material, fuse segment (fuse link) heated and destroyed by passing an overcurrent through it. The overcurrent heats the fuse link beyond the normal level of radiation loss of the generated resistance heat that keeps its temperature below that at which it melts. The fuse link resistance is particularly determined by the material of which it is made, its cross sectional area, its length, and its temperature. Like any electrically conductive wire (and apart from the material of which it is made and its temperature), of the length of a fuse link or connector terminal is doubled, its resistance is also doubled, whereas if its cross sectional area is doubled, its resistance is halved. In short, the resistance of a fuse link or connector terminal is directly proportional to its length and inversely proportional to its cross sectional area.

Some examples of the fabrication of semiconductor devices with fuse arrangements are shown in U.S. Pat. No. 4,635,345, U.S. Pat. No. 5,436,496, U.S. Pat. No. 5,313,424, U.S. Pat. No. 5,420,456, and Japanese Patent Document JA 403124047. The disclosure of these references are incorporated herein by reference.

Electrically activated fuses having tight pitches are well suited for use in semiconductors. However, the prior art has not been able to achieve an optimized electrical fuse design and method of fabrication permitting tight fuse pitches in semiconductor devices while enabling electrical fusing at voltages below about 10 volts, such as during diffusing operation of redundancy activation or custom wiring, i.e., without compromising desired pitch reduction. Moreover, the prior art has not been able to provide a fuse mask for use in lithographic semiconductor fabrication which may produce local areas having widths narrower than the allowed minimum design feature.

Bearing in mind the problems and deficiencies of the prior art, it is therefore an object of the present invention to provide a fuse mask for use in lithographic semiconductor fabrication which may produce local areas having widths narrower than the allowed minimum design feature.

It is another object of the present invention to provide a method of making such a fuse.

A further object of the invention is to provide a method of using such a fuse to produce local areas, designed to be blown, having widths narrower than the allowed minimum design feature.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of making a photolithography mask for use in creating an electrical fuse on a semiconductor structure which comprises initially determining a pattern for a desired electrical fuse, with the pattern including a fuse portion of substantially constant width except for a localized narrowed region of the fuse portion at which the electrical fuse is designed to blow. The method then includes providing a photolithography mask substrate and creating on the photolithography mask substrate a fuse mask element adapted to absorb transmission of an energy beam. The fuse mask element has a first mask portion of substantially constant width corresponding to the desired electrical fuse pattern portion of substantially constant width, and a second mask portion corresponding to the localized narrowed region of the fuse portion. The second mask portion comprises either an additional mask element spaced from the first mask portion, a narrowed width portion, or a gap in the first mask portion. The second mask portion is of a configuration sufficient to create a latent image of the electrical fuse pattern, including the localized narrowed region of the fuse portion at which the electrical fuse is designed to blow, upon passing the energy beam through the photolithography mask and onto a resist layer.

Preferably, the fuse portion of substantially constant width on the determined fuse pattern has a design width less than about 0.25 µm, and wherein the localized narrowed region of the fuse portion has a design width less than the design width of the fuse portion.

In another aspect of the present invention, there is provided a method of forming an electrical fuse on a semiconductor structure comprising providing a photolithography mask having a plurality of mask elements thereon adapted to absorb transmission of an energy beam, a first mask element having a configuration conforming substantially to a pattern for a desired electrical fuse, and a second mask element spaced from the first mask element adjacent a localized narrowed region of the electrical fuse pattern at which the electrical fuse is designed to blow. There is also provided a semiconductor structure having a resist layer thereon for receiving an image conforming to the electrical fuse pattern. The method then includes passing the energy beam through the photolithography mask and onto the resist layer; exposing the resist layer and creating a latent image of the electrical fuse pattern conforming substantially to the configuration of the first mask element except adjacent the second mask element, wherein the latent image of the electrical fuse pattern has a localized, narrowed width compared to an adjacent region of the latent image; and developing the resist layer and using a pattern created by the latent image on the developed resist layer to form an electrical fuse on a semiconductor structure having a localized narrowed region of the electrical fuse pattern at which the electrical fuse is designed to blow conforming to the gap in the mask element.

In a related aspect, the present invention provides a photolithography mask having a plurality of mask elements thereon adapted to absorb transmission of an energy beam, a first mask element having a configuration conforming substantially to a pattern for a desired electrical fuse, and a second mask element spaced from the first mask element adjacent a localized narrowed region of the electrical fuse pattern at which the electrical fuse is designed to blow. Upon passing the energy beam through the photolithography mask and onto a resist layer there is created a latent image of the electrical fuse pattern conforming substantially to the configuration of the first mask element except adjacent the second mask element, wherein the latent image of the electrical fuse pattern has a localized, narrowed width compared to an adjacent region of the latent image.

The first mask element preferably creates an exposed latent image having a width less than about 0.25 µm, and the localized, narrowed width of the latent image exposed on the resist layer has a width less than the width of the first mask element. The first mask element provided preferably has a first portion having an edge and a second portion extending outward from the edge of the first portion, and the second mask element is adjacent the first portion edge and the second portion of the first mask element. The first mask portion edge provided extends inward adjacent the second portion. More preferably, the first mask element provided has a first portion having an edge and a second portion having a substantially rectangular configuration with a length and a width less than the length, with the length of the second portion extending outward from the edge of the first portion, and the first mask portion edge curving inward adjacent either side of the second portion. There is also provided a pair of second mask elements adjacent the first portion edge and the second portion of the first mask element on either side of the second portion.

In a further aspect, the present invention provides a method of forming an electrical fuse on a semiconductor structure which initially comprises providing a photolithography mask having a mask element thereon adapted to absorb transmission of an energy beam and having a configuration conforming substantially to a pattern for a desired electrical fuse, the mask element including a gap therein conforming to a localized narrowed region of the electrical fuse pattern at which the electrical fuse is designed to blow, and providing a semiconductor structure having a resist layer thereon for receiving an image conforming to the electrical fuse pattern. The method further includes passing the energy beam through the photolithography mask and onto the resist layer; exposing the resist layer and creating a latent image of the electrical fuse pattern conforming substantially to the configuration of the mask element except at the gap in the mask element, the gap creating a continuous region of the latent image having a localized, narrowed width compared to an adjacent region of the latent image; and developing the resist layer and using a pattern created by the latent image on the developed resist layer to form an electrical fuse on a semiconductor structure having a localized narrowed region of the electrical fuse pattern at which the electrical fuse is designed to blow conforming to the gap in the mask element.

A related aspect provides a photolithography mask having a mask element thereon adapted to absorb transmission of an energy beam and having a configuration conforming substantially to a pattern for a desired electrical fuse. The mask element includes a gap therein conforming to a localized narrowed region of the electrical fuse pattern at which the electrical fuse is designed to blow. Upon passing the energy beam through the photolithography mask and onto a resist layer there is created a latent image of the electrical fuse pattern conforming substantially to the configuration of the mask element except at the gap in the mask element, with the gap creating a continuous region of the latent image having a localized, narrowed width compared to an adjacent region of the latent image.

Preferably, the mask element creates an exposed latent image having a width less than about 0.25 µm, wherein the localized, narrowed width of the latent imaged exposed on the resist layer has a width less than the width of the mask element. The mask element provided may have a pointed end shape adjacent the gap, a curved end shape adjacent the gap, or a combination of such or similar configurations. More preferably, the mask element provided has a first portion having an edge and a second portion having a substantially rectangular configuration with a length and a width less than the length, with the length of the second portion extending outward from the edge of the first portion, and wherein the gap is provided between the first portion edge and the second portion.

In yet another aspect, the present invention provides a method of forming an electrical fuse on a semiconductor structure which initially comprises providing a photolithography mask having a mask element thereon adapted to absorb transmission of an energy beam and having a configuration conforming substantially to a pattern for a desired electrical fuse, the mask element having a substantially constant width except for a narrowed width portion therein conforming to a localized narrowed region of the electrical fuse pattern at which the electrical fuse is designed to blow and providing a semiconductor structure having a resist layer thereon for receiving an image conforming to the electrical fuse pattern. The method then includes passing the energy beam through the photolithography mask and onto the resist layer, exposing the resist layer and creating a latent image of the electrical fuse pattern conforming substantially to the configuration of the mask element except at the narrowed width portion, narrowed width portion creating a continuous region of the latent image having a localized, narrowed width compared to an adjacent region of the latent image; and developing the resist layer and using a pattern created by the latent image on the developed resist layer to form an electrical fuse on a semiconductor structure having a localized narrowed region of the electrical fuse pattern at which the electrical fuse is designed to blow conforming to the gap in the mask element.

A related aspect of the invention provides a photolithography mask having a mask element thereon adapted to absorb transmission of an energy beam and having a configuration conforming substantially to a pattern for a desired electrical fuse. The mask element has a substantially constant width except for a narrowed width portion therein conforming to a localized narrowed region of the electrical fuse pattern at which the electrical fuse is designed to blow. Upon passing the energy beam through the photolithography mask and onto a resist layer there is created a latent image of the electrical fuse pattern conforming substantially to the configuration of the mask element except at the localized narrowed region, with the localized narrowed region creating a continuous region of the latent image having a localized, narrowed width compared to an adjacent region of the latent image. Preferably, the mask element creates an exposed latent image having a width less than about 0.25 µm, and wherein the localized, narrowed width of the latent imaged exposed on the resist layer has a width less than the width of the mask element.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
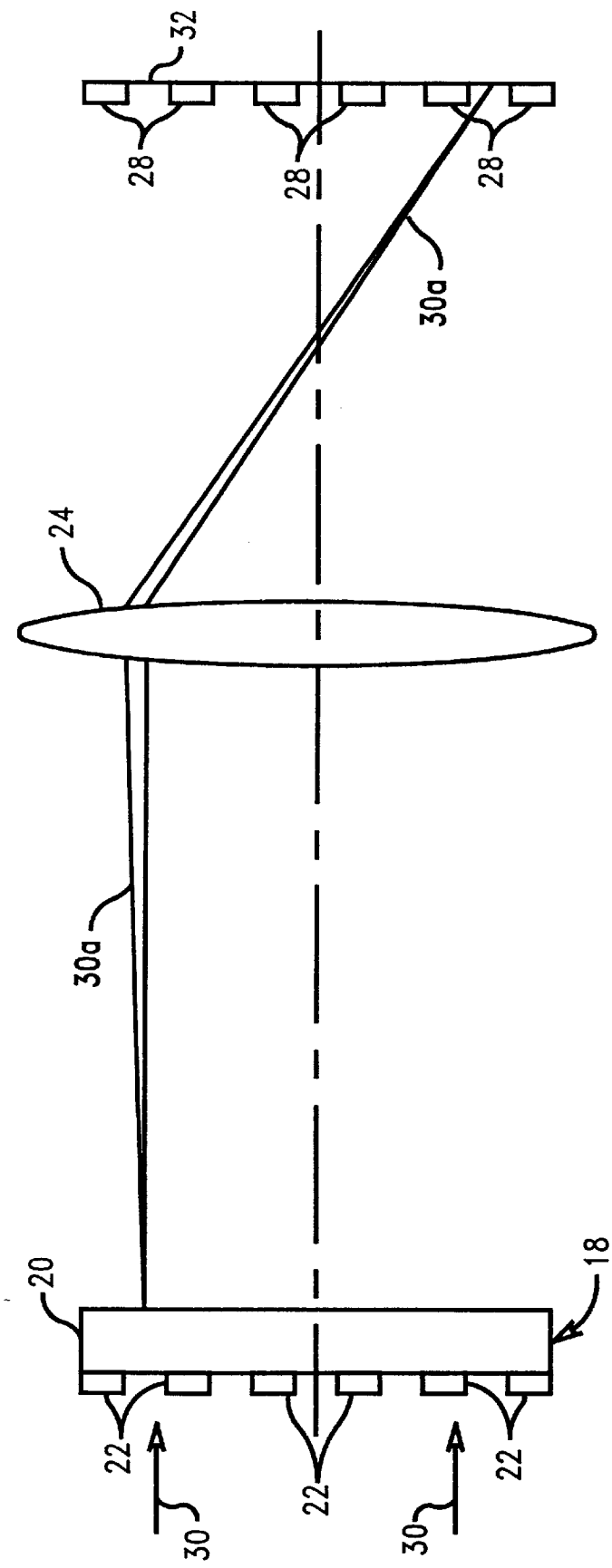
FIG. 1 is a side view of a lithographic mask used to create a fuse structure image during lithography.

In describing the preferred embodiment of the present invention, reference will be made herein to FIGS. 1–4 of the drawings in which like numerals refer to like features of the invention. Features of the invention are not necessarily shown to scale in the drawings.

An electrical fuse is a conducting link between two electrodes which, by the passage of current, can be locally melted causing an open circuit. The current and voltage needed to blow the fuse depends on the amount of material to be melted which is determined by the cross-sectional area of the fuse at the region where the melting is desired. The greater the cross-sectional area, the larger the power requirement. In semiconductor circuits it is desirable to minimize the area penalty for the fuses so that many fuses can be made available without impacting the chip size. However, one is limited by the critical dimension (CD) of the technology used in the design. Even at CD it is often not possible to print fuses without optical distortion caused by the environment in which the fuse resides. For example, features that print at CD inside a memory array may not do so in an isolated portion of the chip without some optical correction. This makes designing fuses (which are considered as isolated structures) quite a challenge at CD, let alone designing sub CD fuses.

The present invention addresses this challenge by providing electrical fuses with local areas having widths narrower than the allowed minimum design feature formed by optical interaction with additional non-fuse features placed in close proximity to the fuse. These features may be of either positive or negative tone (lines or spaces) or a combination of both. The additional proximate features may be either electrically active elements or inactive (dummy) structures. Such inactive structures may be either designed to print on the wafer or to be placed on the mask to create the desired fuse structure but not printed on the wafer. The sub-resolution features to which reference is made herein are for a given lithographic exposure system.

An example of a lithography process in which the mask of the present invention is used is shown in FIG. 1. Radiation comprising energy beam 30 passes through a portion of mask 18 comprising a membrane layer 20 sufficiently transparent to the radiation on which are deposited radiation absorption segments 22 conforming to the fuse image to be projected. The beam 30 portion that passes through the mask 18 between absorption segments 22 is illustrated by beam 30a. Beam 30a is focused by lens system 24 onto the surface 32 of a semiconductor wafer having conventional resist materials sensitive to the electron beam radiation. Radiation absorbed by mask portions 22 does not transfer to the resist layer on surface 32. Thus, a contrasting image 28 is formed on wafer resist surface 32 which conforms to the fuse pattern of absorption layer 22 on the mask.

Figure 2:
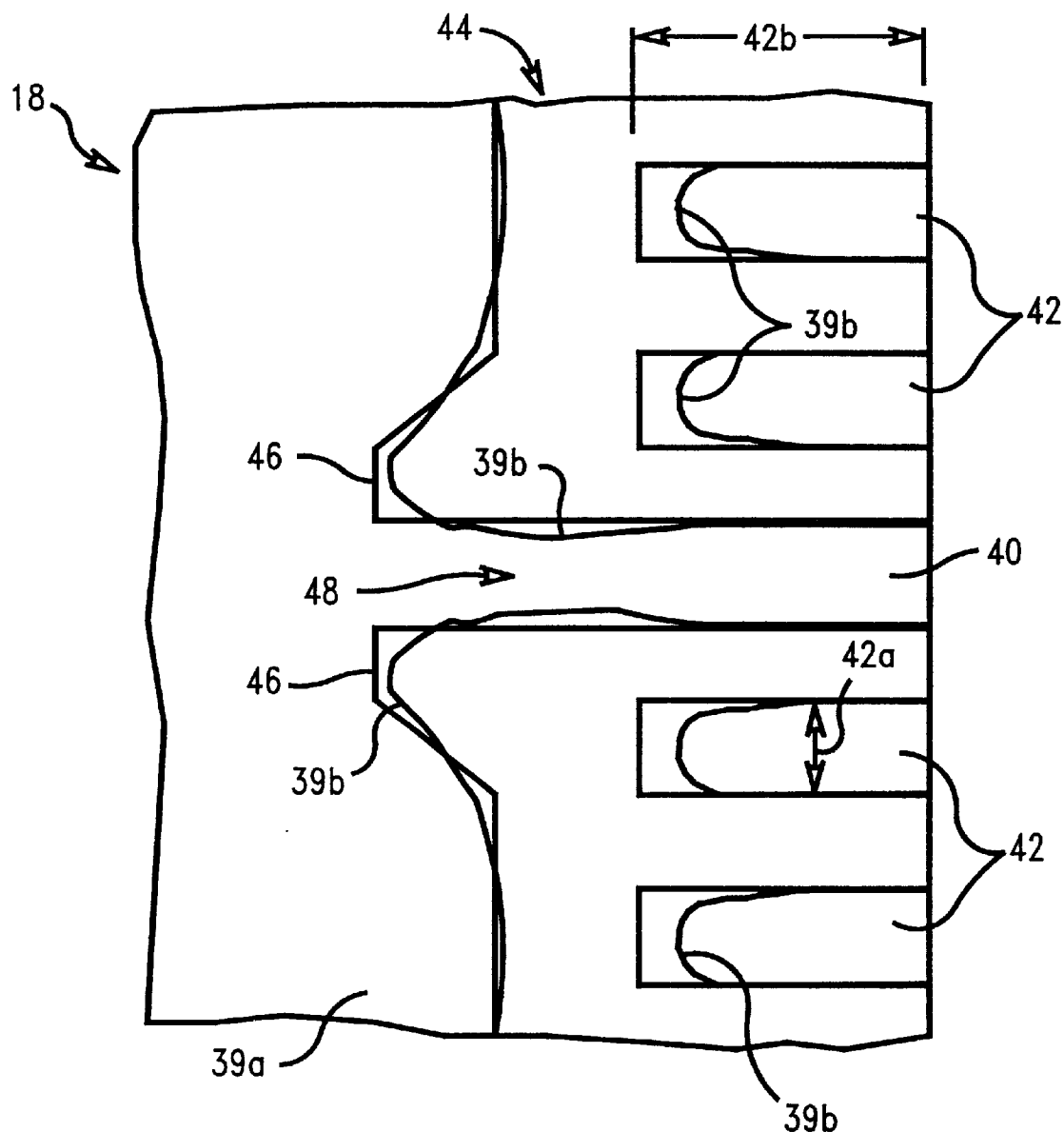
FIG. 2 is a top plan view of a first embodiment of a lithographic mask of the present invention superimposed over the image of the fuse structure created by the mask during lithography.
Figure 3:
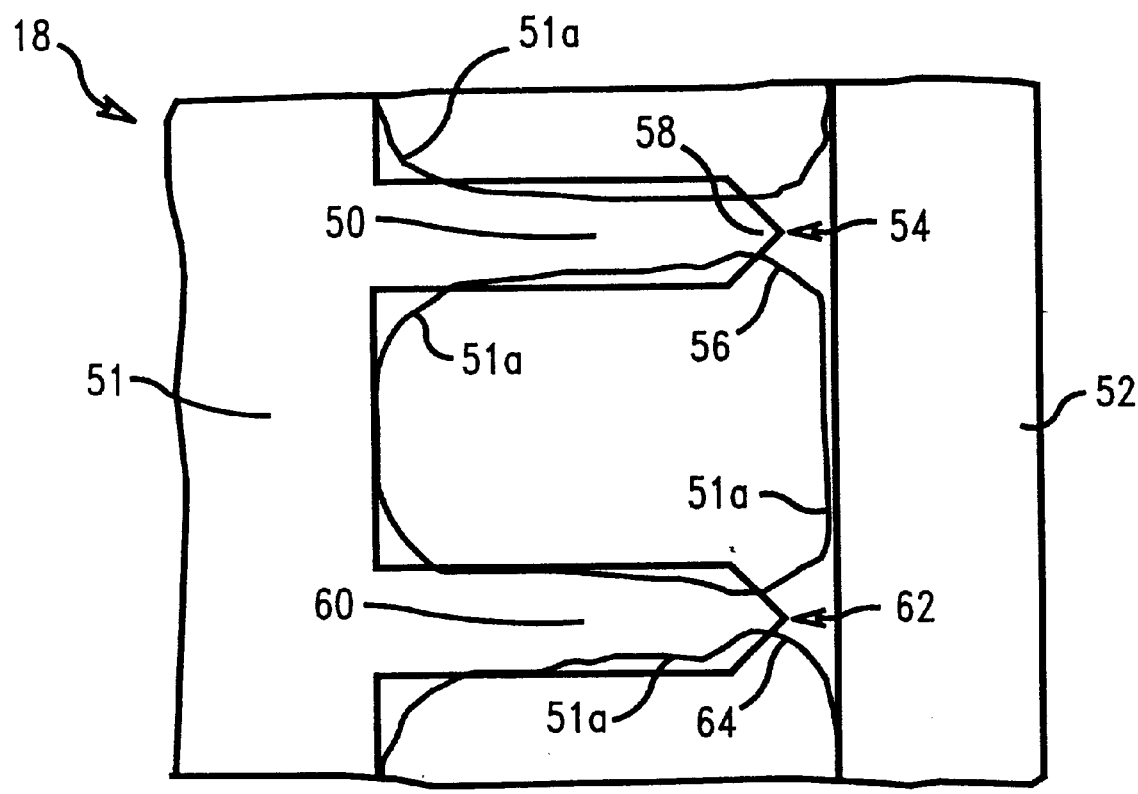
FIG. 3 is a top plan view of a second embodiment of a lithographic mask of the present invention superimposed over the image of the fuse structure created by the mask during lithography.
Figure 4:
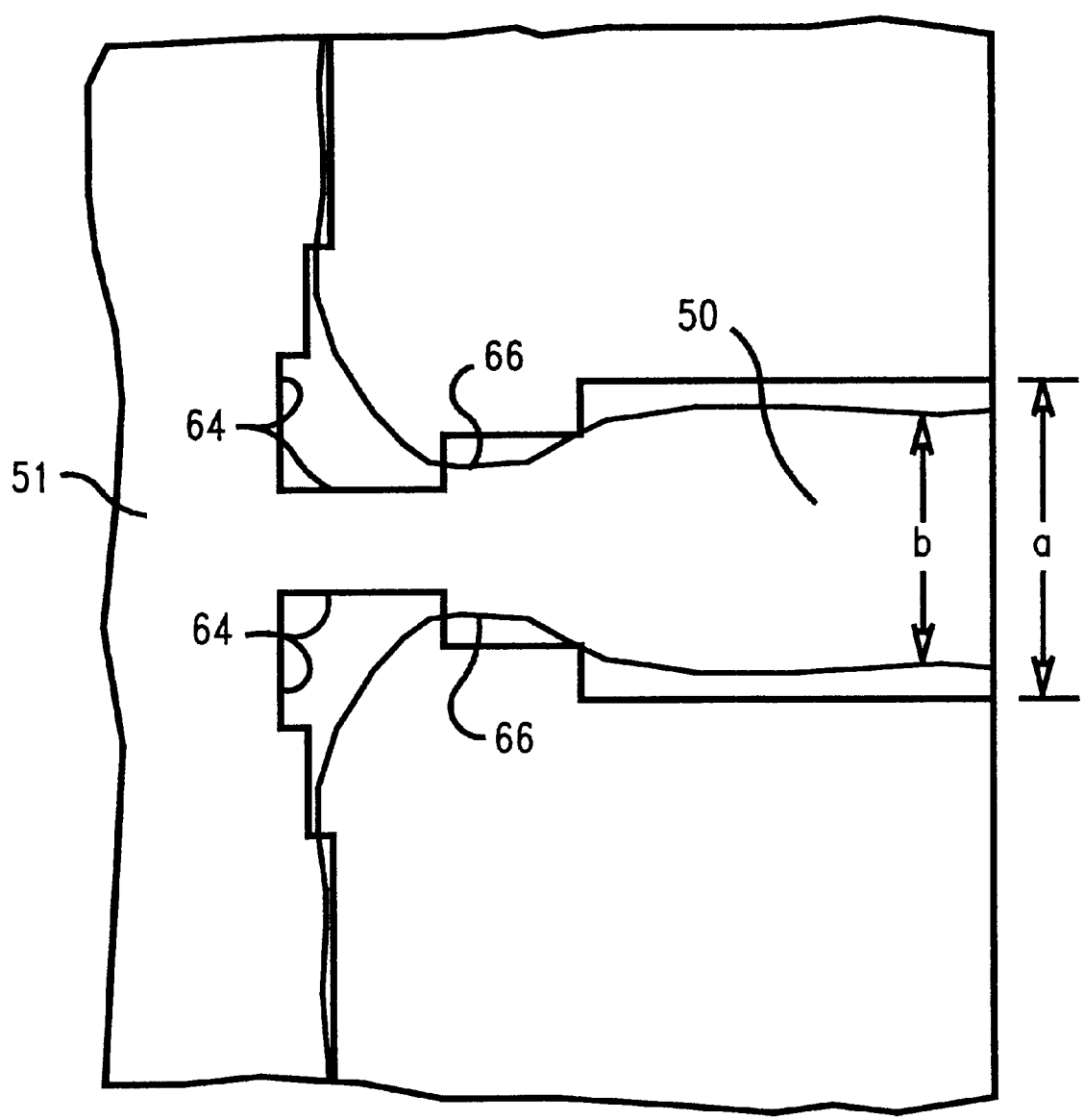
FIG. 4 is a top plan view of a third embodiment of a lithographic mask of the present invention superimposed over the image of the fuse structure created by the mask during lithography.

The preferred embodiments of the fuse masks of the present invention are shown in FIGS. 2, 3 and 4. These figures show the specific detail and fuse configuration in which the shaded areas represent design features which are placed on a lithographic mask and the solid contour lines represent the image of those features as transferred to a semiconductor wafer by a given lithographic exposure system, such as the lithographic system of FIG. 1.

In the first embodiment, the introduction of dummy (preferably not electrically active) structures surround the fuse to produce a localized reduction in the printed line width. This method does not require the use of sub-resolution features but involves an area penalty to accommodate the additional features. By introducing dummy lines of specific length adjacent to the fuse one can produce controlled necking at the end of the fuse due to a local change in spatial frequencies. The shape of the fuse can be modified by varying the number, shape, and length of the dummy features. The shaded areas represent the chrome features on the mask, while the solid line represents the final printed image.

FIG. 2 shows a top view of a mask containing structures for an electrical fuse 40 having additional non-fuse, inactive, dummy structures 42 applied on either side of the fuse element in accordance with the present invention. The mask fuse element 40 is preferably rectangular in configuration, extends outward perpendicularly from an edge of element 39a, and has a constant width along its length. Both the fuse element 40 and the dummy structures 42 may be configured as absorption areas 22 on the mask 18, as shown in FIG. 1. The fuse 40 and dummy structures 42 form an area of specific pitch with a fuse line width equal to or greater than the minimum allowable dimension for a given chip technology. In this area, the fuse 40 is printed to the designed minimum dimension. The width 42a of the dummy lines 42 may be equal to or greater than the minimum allowable dimension for a given chip technology and be transferred to the semiconductor wafer, or the width of the dummy lines may be below the resolution limit of a given exposure system and not transferred to the semiconductor wafer. The length 42b of the dummy lines 42 is specifically chosen for a given lithographic exposure system and conditions to be less than that of the fuse 40 and to provide a gap 44 forming a region of the fuse 48 having a different pitch, i.e., a different spacing (vertically, as shown), between adjacent structures on the mask. When the mask is exposed in a lithography system and the latent image is formed on the resist layer on the substrate, the change in pitch produces a local reduction in the width of the fuse, as transferred to the semiconductor wafer, to form a localized narrowed region 48, narrower than the width of mask fuse element 40, at which the electrical fuse is designed to blow. The shape and extent of this narrowing is tailored by adjusting the shape of other adjacent mask structure, which also serves as one of the electrodes of the fuse 40, for example, by forming concave, indented region 46 at the corner of the intersection of the edges of the fuse element 40 and the edges of body of structure 39a.

In order to implement such a design where the fuse formed on the semiconductor substrate has a region of reduced dimension to facilitate fuse blow, the following procedure can be adopted. The lithography mask to be used to create the shapes is made to resemble the shaded pattern 39a shown in FIG. 2. Because of optical effects, the latent image that is actually printed on the photoresist is what is defined by the dark, solid line 39b. The pattern on the photoresist is then transferred to a conducting substrate layer using standard etching techniques e.g. reactive ion etching (RIE). Alternatively after the resist pattern has been defined, the desired shape can also be additively plated up through the resist from an underlying seed layer. In yet another method, after the resist pattern is defined and transferred into an insulating layer on the substrate, conducting layers can be deposited into the etched pattern and later polished to define the final desired shape. For dimensions that are typically larger than 0.25 µm or so, patterns 39a and 39b are nominally identical. As feature dimensions drop below 0.25 µm, several optical effects emerge making mask configuration 39a and the resist latent image 39b significantly different, and the purpose of this invention is to use that optical effect to advantage.

Figure 3A:
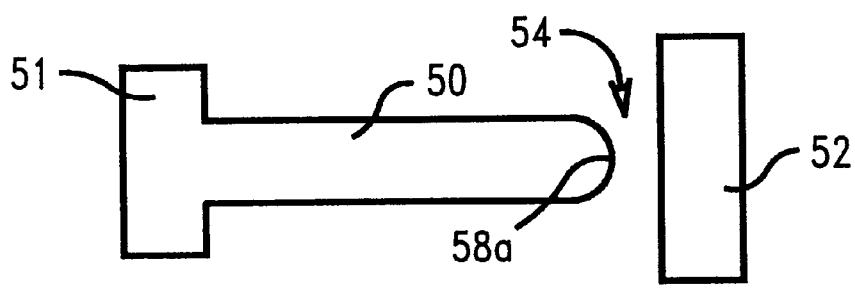
FIG. 3a is a top plan view of an alternate fuse end from that shown in FIG. 3.

In another embodiment of the present invention, the introduction of sub-resolution gaps in a continuous pattern produces a localized reduction in the printed line width. In FIG. 3 it is shown that by varying the size of the sub-resolution gap the degree of necking in the final image can be controlled. The fuse end may be tapered to provide greater control over the necking of the printed feature and compensate for line end shortening effects, reducing sensitivity to lithographic processing variability. Electrical fuse elements 50 and 60 are again shown as rectangular structures extending perpendicularly outward from the edge of wiring bus mask structure 51. In electrical fuse mask element 50, there is introduced in an otherwise continuous pattern a gap 54 in the mask pattern between the fuse mask structure 50 and the connecting wiring bus mask structure 52, where the gap 54 is of a size below the resolution limit of the lithographic exposure system employed. Again, as in FIG. 2, the shaded area represents the chrome features or elements on the mask itself, and the dark line 51a is the latent image actually created by lithographic exposure on the substrate resist layer. The introduction of the gap 54 produces on the resist layer a localized reduction in the width 56 of the latent image of the continuous fuse as transferred to the semiconductor wafer. The shape of the transferred fuse pattern and its sensitivity to process variation may be controlled by choosing a specific end shape 58 and gap 54, for example the pointed end configuration shown. Other end configurations may also be employed, such as convex curved ends, as shown in FIG. 3a, where fuse element 50 has curved end 58a. The gap may be changed to affect the exact width reduction to be achieved in the fuse image on the resist. In the fuse mask embodiment shown in the lower portion of FIG. 3, mask fuse element 60 is designed with a gap 62 at wiring bus structure 52 which is larger than the gap 54 in the upper portion of the figure. This produces a narrower localized fuse reduction 64 in the latent image transferred to the semiconductor wafer. The position of the gaps 54 and 62 is not restricted to the ends of the fuse structure, and may be made at any point along the length of fuse structure 50 or 60.

FIG. 4 shows yet another embodiment of the present invention in which, instead of the gap shown in FIG. 3, there is a localized narrowed region of the mask fuse element. The introduction of sub-resolution positive tone features in a continuous pattern produces a localized reduction in the printed line width. In FIG. 4 it is shown that by varying the size of the fuse end and the surrounding feature using sub-resolution shapes the degree of necking in the final image can be controlled. The stepped line 64 represents the chrome feature on the mask where the mask element is drastically narrowed down compared to the width α of the rectangular section of the fuse structure 50. The smooth curve 66 represents the final printed image of the narrowed down fuse section, as created by the lithographic processing of the latent image on the resist layer. The ratio of localized narrowed region 66 to width b of the rectangular section on the final printed fuse is greater than the ratio of narrowed region 64 to width a of the fuse elements on the mask.

Implementation of the fuse mask configuration of FIGS. 3 and 4 to form a fuse structure on a semiconductor substrate is made in the same manner as described above for the fuse structure of FIG. 2.

Accordingly, the present invention achieves the object described above and employs optical proximity effects to produce fuses of controlled shape at or below the chip minimum CD (critical dimension) without impacting lithographic process windows or mask making capability. The invention herein provides a fuse mask for use in lithographic semiconductor fabrication which may produce local areas having widths narrower than the allowed minimum design feature, along with a method of making such a fuse and a method of using such a fuse to produce local areas, designed to be blown, having widths narrower than the allowed minimum design feature. The invention achieves this by optical interaction with features (gaps, reduced widths and dummy structures) placed in close proximity to the portion of the fuse designed to blow, to provide the localized narrowed region.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a photolithography mask for use in creating an electrical fuse on a semiconductor structure comprising:

determining a pattern for a desired electrical fuse, said pattern including a fuse portion of substantially constant width except for a localized narrowed region of the fuse portion at which the electrical fuse is designed to blow;

providing a photolithography mask substrate; and creating on said photolithography mask substrate a fuse mask element adapted to absorb transmission of an energy beam, said fuse mask element having a first mask portion of substantially constant width corresponding to the desired electrical fuse pattern portion of substantially constant width, and a second mask portion corresponding to the localized narrowed region of the fuse portion, said second mask portion selected from the group consisting of:

a) an additional mask element spaced from the first mask portion, b) a narrowed width portion; and c) a gap in the first mask portion, said second mask portion being of a configuration sufficient to create a latent image of said electrical fuse pattern, including the localized narrowed region of the fuse portion at which the electrical fuse is designed to blow, upon passing said energy beam through said photolithography mask and onto a resist layer.

2. The method of claim 1 wherein the fuse portion of substantially constant width on the determined fuse pattern has a design width less than about 0.25 μm, and wherein the localized narrowed region of the fuse portion has a design width less than the design width of the fuse portion.

3. A method of forming an electrical fuse on a semiconductor structure comprising:

providing a photolithography mask having a plurality of mask elements thereon adapted to absorb transmission of an energy beam, a first mask element having a configuration conforming substantially to a pattern for a desired electrical fuse, and a second mask element spaced from the first mask element adjacent a localized narrowed region of the electrical fuse pattern at which the electrical fuse is designed to blow;

providing a semiconductor structure have a resist layer thereon for receiving an image conforming to the electrical fuse pattern;

passing said energy beam through said photolithography mask and onto said resist layer;

exposing said resist layer and creating a latent image of said electrical fuse pattern conforming substantially to the configuration of said first mask element except adjacent said second mask element, wherein said latent image of said electrical fuse pattern has a localized, narrowed width compared to an adjacent region of said latent image; and developing said resist layer and using a pattern created by said latent image on the developed resist layer to form an electrical fuse on a semiconductor structure having a localized narrowed region of the electrical fuse pattern at which the electrical fuse is designed to blow conforming to the gap in the mask element.

4. The method of claim 3 wherein said first mask element creates an exposed latent image having a width less than about 0.25 μm, and wherein the localized, narrowed width of said latent image exposed on said resist layer has a width less than the width of the a first mask element.

5. The method of claim 3 wherein said first mask element provided has a first portion having an edge and a second portion extending outward from the edge of said first portion, and wherein said second mask element is adjacent the first portion edge and the second portion of the first mask element.

6. The method of claim 5 wherein said first mask portion edge provided extends inward adjacent said second portion.

7. The method of claim 3 wherein said first mask element provided has a first portion having an edge and a second portion having a substantially rectangular configuration with a length and a width less than said length, the length of said second portion extending outward from the edge of said first portion, said first mask portion edge curving inward adjacent either side of said second portion, and wherein there is provided a pair of second mask elements adjacent the first portion edge and the second portion of the first mask element on either side of said second portion.

8. A photolithography mask having a plurality of mask elements thereon adapted to absorb transmission of an energy beam, a first mask element having a configuration conforming substantially to a pattern for a desired electrical fuse, and a second mask element spaced from the first mask element adjacent a localized narrowed region of the electrical fuse pattern at which the electrical fuse is designed to blow, wherein upon passing said energy beam through said photolithography mask and onto a resist layer there is created a latent image of said electrical fuse pattern conforming substantially to the configuration of said first mask element except adjacent said second mask element, wherein said latent image of said electrical fuse pattern has a localized, narrowed width compared to an adjacent region of said latent image.

9. The mask of claim 8 wherein said first mask element is adapted to create an exposed latent image having a width less than about 0.25 μm, and wherein the localized, narrowed width of said latent imaged exposed on said resist layer has a width less than the width of the first mask element.

10. The mask of claim 8 wherein said first mask element has a first portion having an edge and a second portion extending outward from the edge of said first portion, and wherein said second mask element is adjacent the first portion edge and the second portion of the first mask element.

11. The method of claim 10 wherein said first mask portion edge extends inward adjacent said second portion.

12. The method of claim 8 wherein said first mask element has a first portion having an edge and a second portion having a substantially rectangular configuration with a length and a width less than said length, the length of said second portion extending outward from the edge of said first portion, said first mask portion edge curving inward adjacent either side of said second portion, and including a pair of second mask elements adjacent the first portion edge and the second portion of the first mask element on either side of said second portion.

13. A method of forming an electrical fuse on a semiconductor structure comprising:

providing a photolithography mask having a mask element thereon adapted to absorb transmission of an energy beam and having a configuration conforming substantially to a pattern for a desired electrical fuse, said mask element including a gap therein conforming to a localized narrowed region of the electrical fuse pattern at which the electrical fuse is designed to blow;

providing a semiconductor structure have a resist layer thereon for receiving an image conforming to the electrical fuse pattern;

passing said energy beam through said photolithography mask and onto said resist layer;

exposing said resist layer and creating a latent image of said electrical fuse pattern conforming substantially to the configuration of said mask element except at said gap in said mask element, said gap creating a continuous region of said latent image having a localized, narrowed width compared to an adjacent region of said latent image; and developing said resist layer and using a pattern created by said latent image on the developed resist layer to form an electrical fuse on a semiconductor structure having a localized narrowed region of the electrical fuse pattern at which the electrical fuse is designed to blow conforming to the gap in the mask element.

14. The method of claim 13 wherein said mask element creates an exposed latent image having a width less than about 0.25 μm, and wherein the localized, narrowed width of said latent imaged exposed on said resist layer has a width less than the width of the mask element.

15. The method of claim 13 wherein said mask element provided has a pointed end shape adjacent said gap.

16. The method of claim 13 wherein said mask element provided has a curved end shape adjacent said gap.

17. The method of claim 13 wherein said mask element provided has a first portion having an edge and a second portion having a substantially rectangular configuration with a length and a width less than said length, the length of said second portion extending outward from the edge of said first portion, and wherein said gap is provided between the first portion edge and said second portion.

18. A photolithography mask having a mask element thereon adapted to absorb transmission of an energy beam and having a configuration conforming substantially to a pattern for a desired electrical fuse, said mask element including a gap therein conforming to a localized narrowed region of the electrical fuse pattern at which the electrical fuse is designed to blow, wherein upon passing said energy beam through said photolithography mask and onto a resist layer there is created a latent image of said electrical fuse pattern conforming substantially to the configuration of said mask element except at said gap in said mask element, said gap creating a continuous region of said latent image having a localized, narrowed width compared to an adjacent region of said latent image.

19. The mask of claim 18 wherein said mask element is adapted to create an exposed latent image having a width less than about 0.25 μm, and wherein the gap is adapted to create a localized, narrowed width of said latent imaged exposed on said resist layer having a width less than the width of the mask element.

20. The mask of claim 18 wherein said mask element provided has a pointed end shape adjacent said gap.

21. The mask of claim 18 wherein said mask element provided has a curved end shape adjacent said gap.

22. The mask of claim 18 wherein said mask element has a first portion having an edge and a second portion having a substantially rectangular configuration with a length and a width less than said length, the length of said second portion extending outward from the edge of said first portion, and wherein said gap is disposed between the first portion edge and said second portion.

23. A method of forming an electrical fuse on a semiconductor structure comprising:

providing a photolithography mask having a mask element thereon adapted to absorb transmission of an energy beam and having a configuration conforming substantially to a pattern for a desired electrical fuse, said mask element having a substantially constant width except for a narrowed width portion therein conforming to a localized narrowed region of the electrical fuse pattern at which the electrical fuse is designed to blow;

providing a semiconductor structure have a resist layer thereon for receiving an image conforming to the electrical fuse pattern;

passing said energy beam through said photolithography mask and onto said resist layer;

exposing said resist layer and creating a latent image of said electrical fuse pattern conforming substantially to the configuration of said mask element except at said narrowed width portion, narrowed width portion creating a continuous region of said latent image having a localized, narrowed width compared to an adjacent region of said latent image; and developing said resist layer and using a pattern created by said latent image on the developed resist layer to form an electrical fuse on a semiconductor structure having a localized narrowed region of the electrical fuse pattern at which the electrical fuse is designed to blow conforming to the gap in the mask element.

24. The method of claim 23 wherein said mask element creates an exposed latent image having a width less than about 0.25 $\mu$m, and wherein the localized, narrowed width of said latent imaged exposed on said resist layer has a width less than the width of the mask element.

25. A photolithography mask having a mask element thereon adapted to absorb transmission of an energy beam and having a configuration conforming substantially to a pattern for a desired electrical fuse, said mask element having a substantially constant width except for a narrowed width portion therein conforming to a localized narrowed region of the electrical fuse pattern at which the electrical fuse is designed to blow, wherein upon passing said energy beam through said photolithography mask and onto a resist layer there is created a latent image of said electrical fuse pattern conforming substantially to the configuration of said mask element except at said localized narrowed region, said localized narrowed region creating a continuous region of said latent image having a localized, narrowed width compared to an adjacent region of said latent image.

26. The mask of claim 25 wherein said mask element is adapted to create an exposed latent image having a width less than about 0.25 $\mu$m, and wherein the gap is adapted to create a localized, narrowed width of said latent imaged exposed on said resist layer having a width less than the width of the mask element.

* * * * *